United States Patent [19]
Pon

[11] Patent Number: 5,805,517
[45] Date of Patent: Sep. 8, 1998

[54] SELF-CALIBRATING ADDRESS TRANSITION DETECTION SCHEME

[75] Inventor: Harry Q. Pon, Sacremento, Calif.

[73] Assignee: Intel Corporation, Santa Clara, Calif.

[21] Appl. No.: 773,601

[22] Filed: Dec. 27, 1996

[51] Int. Cl.$^6$ ...................................................... G11C 7/04
[52] U.S. Cl. ...................... 365/212; 365/211; 365/233.5; 365/189.05; 365/227; 365/194
[58] Field of Search ........................... 365/233.5, 189.05, 365/227, 194, 212, 211

[56] References Cited

U.S. PATENT DOCUMENTS

| | | | |
|---|---|---|---|
| 4,622,476 | 11/1986 | Venkatesh | 327/513 |
| 4,742,247 | 5/1988 | Venkatesh | 327/51 |
| 5,418,479 | 5/1995 | Sambandan | 326/93 |
| 5,465,062 | 11/1995 | Fong | 327/172 |

OTHER PUBLICATIONS

David Hoff et al, IEEE Journal of Solid State Circuits, "A 23–ns 256K EPROM with Double–Layer Metal and Address Transition Detection", vol. 24, No. 5, Oct. 1989, pp. 1250–1258.

1986 IEEE Solid-State Circuits Conference, "Session III Non–Volatile and Application Specific Memories", pp. 40–41.

*Primary Examiner*—David C. Nelms
*Assistant Examiner*—Andrew Q. Tran
*Attorney, Agent, or Firm*—Blakely, Sokoloff, Taylor & Zafman

[57] ABSTRACT

An address transition detector receives one or more address signals. The address transition detector provides a transition detection signal in response to a transition of at least one of the address signals. A pulse generator is coupled to receive the transition detection signal and an environmental input. The pulse generator provides a control signal having a delay based upon an environmental input. The environmental control input may be based upon variables such as temperature, supply voltage, or process skew.

26 Claims, 10 Drawing Sheets

SELF-CALIBRATING ADDRESS TRANSITION DETECTION SCHEME

FIELD OF THE INVENTION

The present invention relates to the field of integrated circuits. More particularly, this invention relates to a device that employs an address transition detection (ATD) scheme.

BACKGROUND OF THE INVENTION

Address transition detection (ATD) devices are well-known in the prior art. They are used in a variety of devices, including memory devices. An ATD device typically has an address input, which is comprised of one or more address lines, and one or more device control signals. When there is a transition in the address input qualified by the device control signals, then the ATD device performs one or more operations in response to the address input transition. For example, with regard to an ATD memory device, a transition in the address input results in the ATD memory device providing as output the data stored at the location specified by the new address input.

In one implementation of an ATD memory device, internal ATD control pulses are provided to various circuits of the ATD device responsive to the transition of the address input. The internal ATD control pulses control the various circuits of the device. For example, the internal control pulses may enable or disable a sense amp, they may control the latching of data, pre-charge key nodes, and/or they may power down a particular circuit that is not currently being used.

FIG. 1 illustrates a representative prior art ATD device 10. ATD device 10 includes an address transition detector 20, ATD control pulse generators 28 and circuit A 30. The ATD control pulse generators may include a master pulse generator 40, a sense amp pulse generator 42, and an I/O latch generator 44. Additional circuits, such as circuit B 32 and circuit C 34 can also be included in the ATD device 10. An address input 34 and control signal input 36 are provided to the ATD device. The ATD device in response to a change in the address input 34 and/or control signal input 36 provides address transition signals 22 to a summation circuit 24. The summation circuit in turn provides an output to the ATD control pulse generators 28 to provide ATD (control signals to circuit A 30, circuit B 32 and circuit C 34. As an example, the master pulse generator 40 provides a control signal 50 to circuit A. Circuit A may access a particular memory cell within a memory array responsive to the control signal 50, for example. The sense amp pulse generator provides a control signal 52 to circuit B 32. Circuit B 32 may be a sense amp which samples the memory cell accessed in circuit A. Finally, the I/O latch generator 44 provides a control signal 54 to circuit C 34. Control signal 54 may cause circuit C to allow an output to be provided out of the ATD device 10.

The rising edge and falling edges of the control signals 50, 52 and 54 determine when circuits 30, 32 and 34, respectively, turn off and on or perform some other operation or function.

The timing of control signals in an ATD device may deteriorate due to changes in the temperature or the operating voltage of the device. Additionally, control signals may fluctuate due to the process skew of the device itself due to manufacturing variables. For example, some devices may run faster than other devices. This results in potential deterioration of the control signals and can result in unpredictable errors. Because some control signals are derived from other signals, a deterioration in one signal can result in the problem being propagated to other control signals. In FIG. 1, the sense amp pulse generator 42 and the I/O latch generator 44 are derived from master pulse generator 40, for example.

One prior art solution to this problem is to provide selectable delays within the ATD device to adjust the timing of the ATD control signals generated. For example, each main ATD control signal may have several possible delay circuits associated with it. At test time, the manufacturer determines the optimal delay for the device. At this time the selectable delay is permanently selected. This is done, for example, by blowing fuses or programming CAM's (Content Addressable Memory) for coupling each main ATD control signal to an appropriate delay circuit. Derivative control signals can be generated from the main control signals.

Another prior art solution is to link certain control signals to other control signals. For example, a second control signal is linked to a first control signal by forcing the second control signal to become active when the first control signal reaches a specific voltage threshold. However, if there is deterioration of the first control signal, this deterioration may be propagated to the second control signal.

One means for partially correcting for temperature variations is described in U.S. Pat. No. 4,742,247, entitled "CMOS Address Transition Detector with Temperature Compensation," by Venkatesh, and U.S. Pat. No. 4,622,476, entitled "Temperature Compensated Active Resistor," by Venkatesh, both of which are assigned to Advanced Micro Devices, Inc. of Sunnyvale, Calif.

The Venkatesh patents describe circuitry for providing a constant voltage. This constant voltage is used only within an address transition detector to provide an output pulse having a substantially constant pulse width over a range of temperatures. The Venkatesh patents, however, do not provide for corrections to the ATD control pulse generators.

Thus, the prior art solutions do not adequately account for device control signal timings based on temperature, supply voltage, or process skew within an ATD device.

SUMMARY OF THE INVENTION

An address transition detector receives one or more address signals. The address transition detector provides a transition detection signal in response to a transition of at least one of the address signals. A pulse generator is coupled to receive the transition detection signal and an environmental input. The pulse generator provides a control signal having a delay based upon an environmental input. The environmental control input may be based upon variables such as temperature, supply voltage, or process skew.

These and other advantages of the present invention are fully described in the following detailed description.

DETAILED DESCRIPTION

An address transition detection (ATD) scheme using an environmental input to adjust ATD control signals is described. The environmental input can provide adjustment based upon temperature, voltage, and/or process skew of the ATD device.

Figure 1:
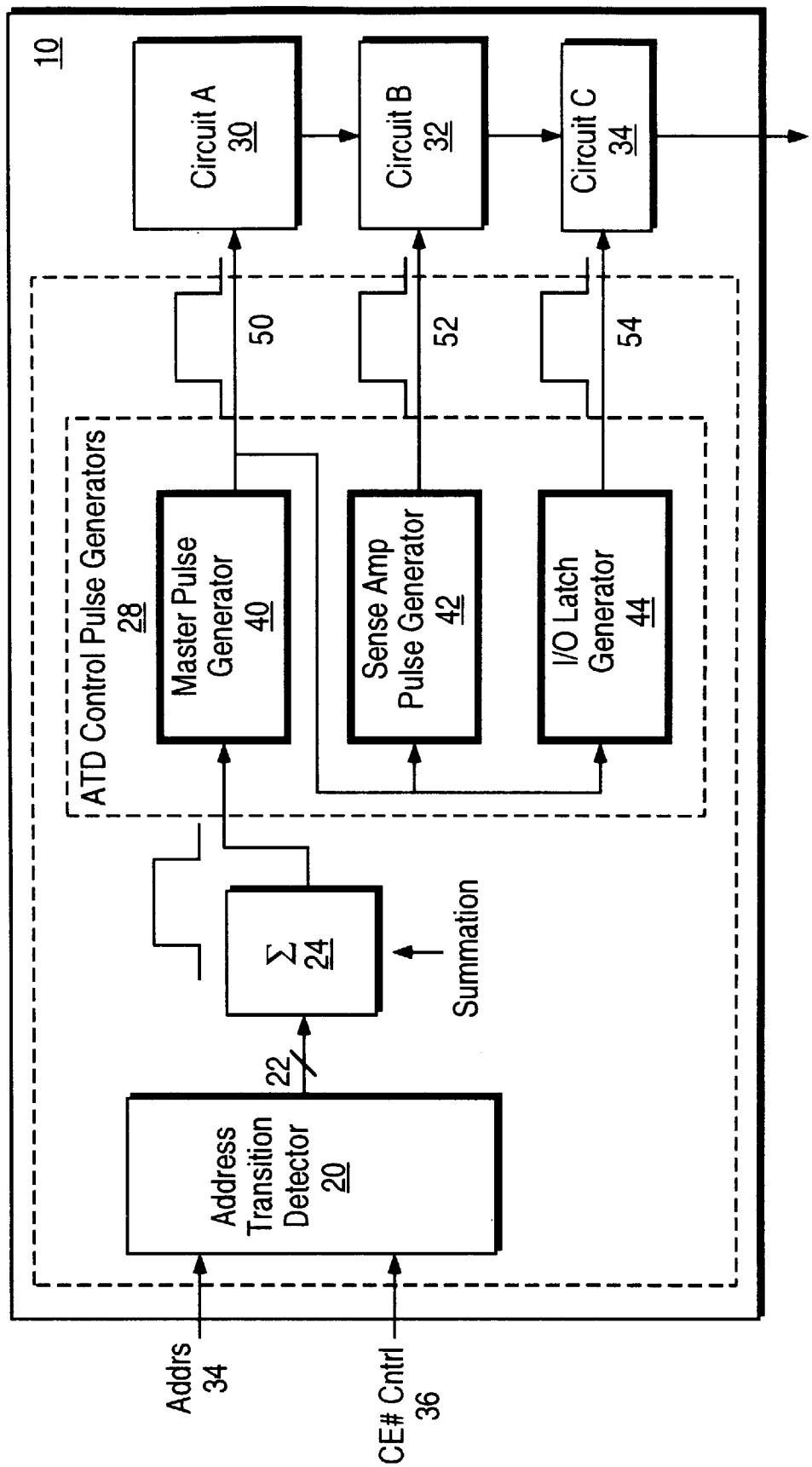
FIG. 1 illustrates a representative prior art ATD device.
Figure 2:
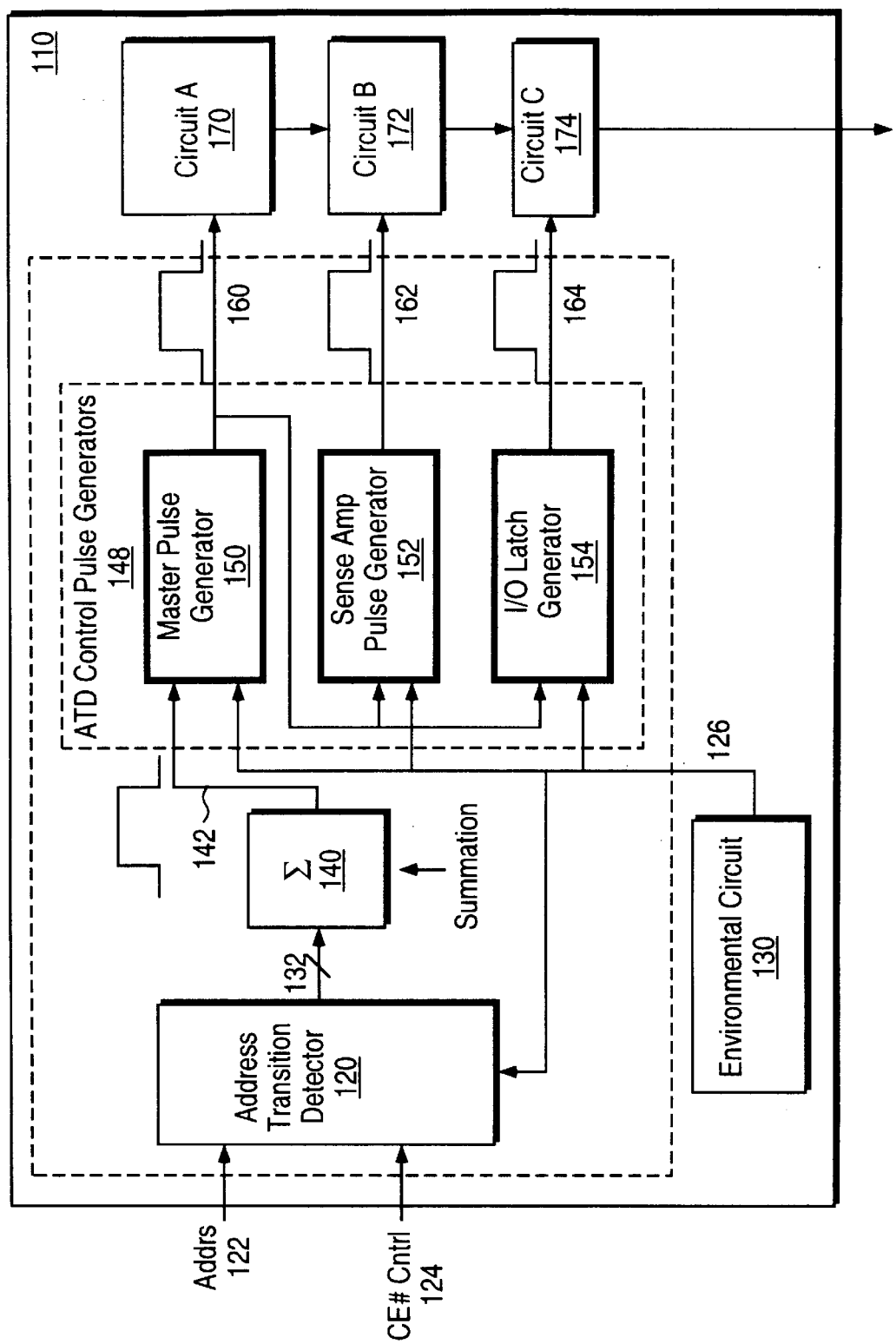
FIG. 2 is a block diagram of an ATD device which includes an environmental circuit.

FIG. 2 is a block diagram of an ATD device 110 which includes an environmental circuit 130. The ATD 120 receives an address input 122, device control input 124, and an environmental input 126. The environmental input 126 is generated by environmental circuit 130. In response to a transition in the address input 122 qualified by the device control input 124, the address transition detector provides one or more transition detection signals 132 to summation circuitry, as will be described further with respect to FIG. 7. The summation circuitry provides a summation signal 142 to the master pulse generator 150. The master pulse generator 150 provides a master pulse control signal 160 to other ATD control pulse generators, such as sense amp pulse generator 152 and I/O latch generator 154. The master pulse control signal 160 is also provided to circuit A 170. In one embodiment, the ATD also provides one or more control signals 162 and 164 to other circuits, such as circuit B 172 and circuit C 174.

Figures 1, 3:
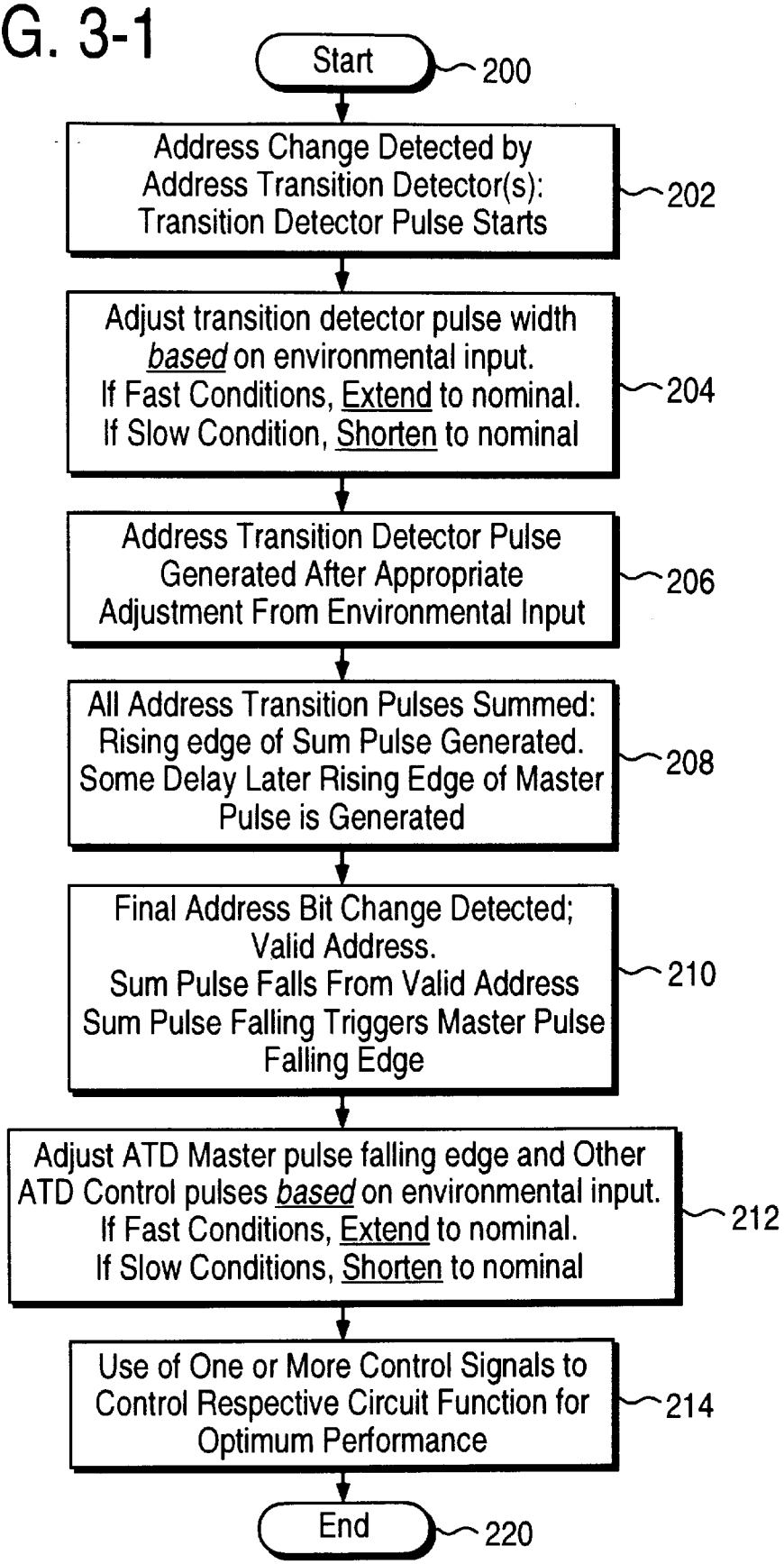
FIG. 3 is a flowchart describing the steps taken by an ATD device in using the present invention.
Figures 2, 3:
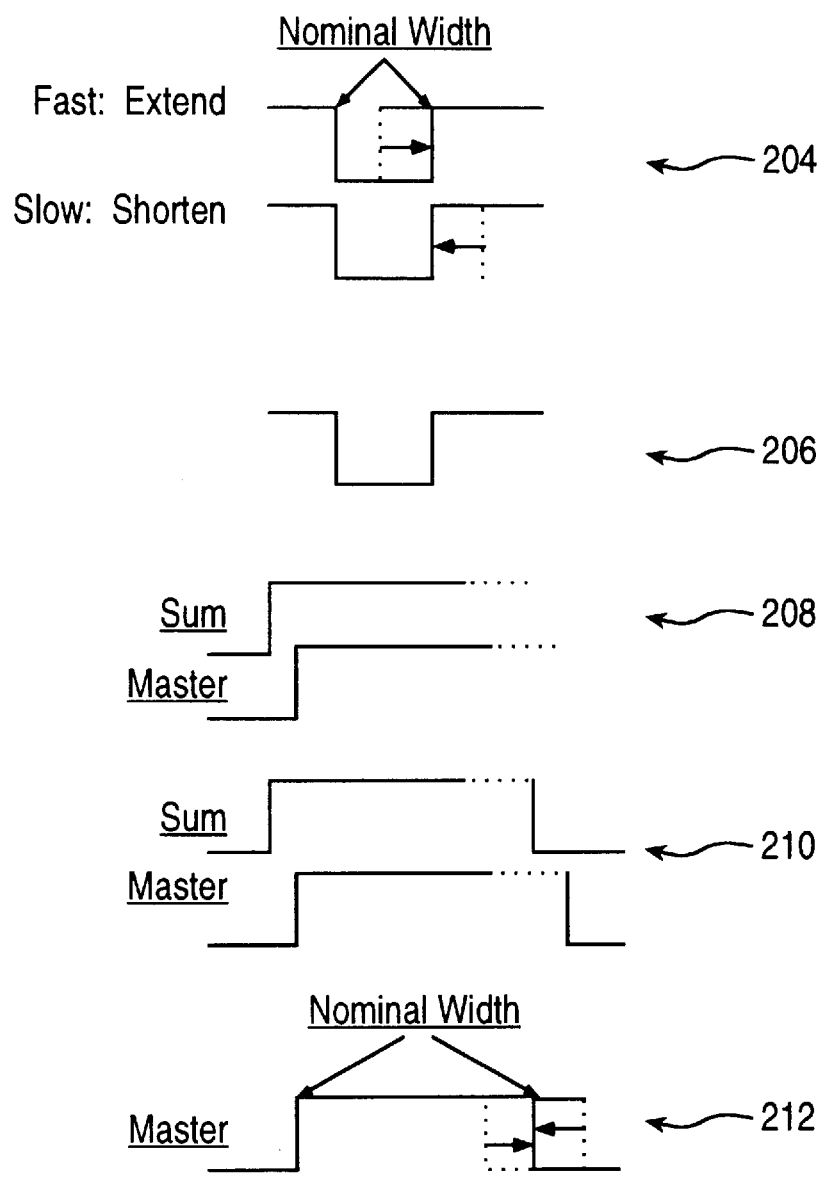

FIG. 3 is a flowchart describing the steps taken by an ATD device in using the present invention. Sample control signals are shown alongside some of the steps of the flowchart.

The flowchart starts at block 200, from which it continues at block 202. At block 202, an address change is detected by one or more address transition detectors. A separate address transition detector is coupled to each address signal. In response to a transition on an address signal, a transition detection pulse is initiated.

Operation continues at block 204, at which a variable delay is added to the transition pulse. The variable delay is provided such that the transition pulse has a nominal width appropriate for the particular device implementation. The delay is produced based upon an input from the environment signal 126 from the environmental circuit 130. In one implementation, the environmental circuit 130 provides an input voltage that is inversely related to temperature. Thus, as the temperature increases, the environmental input has a voltage that decreases. Similarly, as the temperature decreases, the environmental input has a voltage that increases. The input from the environmental circuit allows the address transition detector to compensate for temperature, voltage and process skew of the device.

If fast conditions exist, characterized by high VCC, low temperature, or fast process skew, then the address transition detector using the input from the environmental circuit will add a longer delay to result in a transition detection signal having a nominal pulse width. Conversely, if slow conditions exist, characterized by low Vcc, high temperature, or slow process skew, then the address transition detector using the input from the environmental circuit will add a shorter delay to result in a transition detection signal having the nominal pulse width.

At block 206, the address transition detector pulse is generated and provided to summation circuitry 140. Operation continues at block 208, at which all of the address transition signals are summed together. A summation signal 142 is provided as an output of the summation circuitry 140. The summation signal is provided to the master pulse generator 150 for providing a master pulse control signal 160.

Operation continues at block 210, at which a final address transition is detected. The address is stable indicative of a valid address. The summation signal falls due to no more address transition signals being generated. Similarly, the master pulse signal will subsequently fall after a delay based upon an environmental input provided, as shown in block 212.

At block 212, the master pulse signal is adjusted based upon an environmental input 126 provided to the master pulse generator 150. Similar to the address transition detector receiving the first environmental input, the master pulse generator also adds a longer delay to the falling edge of the master pulse control signal if fast conditions exist, or the master pulse generator adds a shorter delay to the falling edge of the master pulse control signal if slow conditions exist.

At block 214, the master pulse control signal and other control signals produced by the ATD control pulse generators 148 are used to control respective circuits for optimum performance.

For one embodiment of the invention, the ATD device is a memory device. When an address or device control signal change occurs the device reads from a memory array at the address provided to the ATD device. If a write signal is enabled to the ATD device, data is written to the address in the memory array instead.

Figure 10:
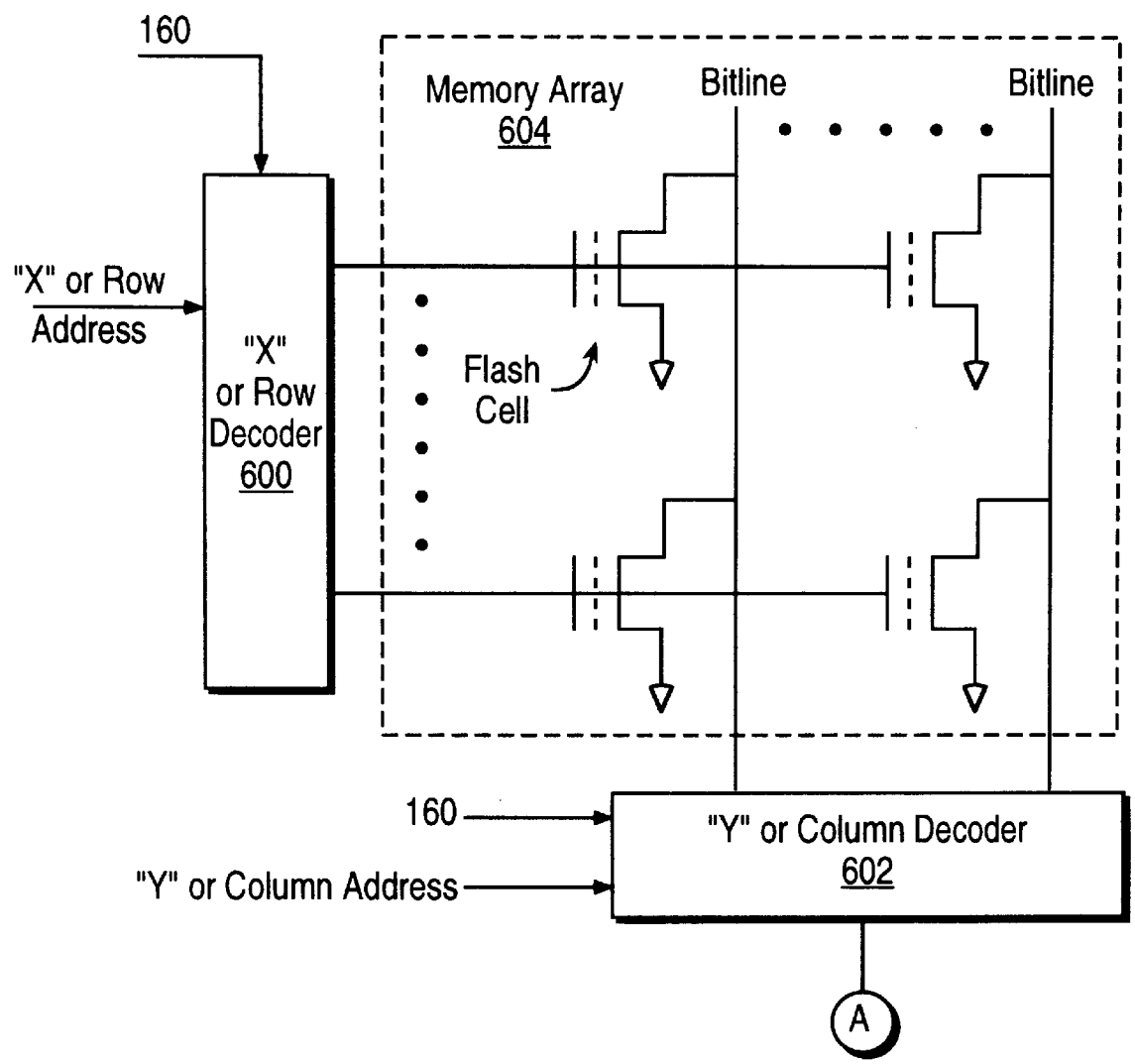
FIGS. 10, 11, and 12 show an example of how ATD control signals might be used in one embodiment of a memory device.
Figure 11:
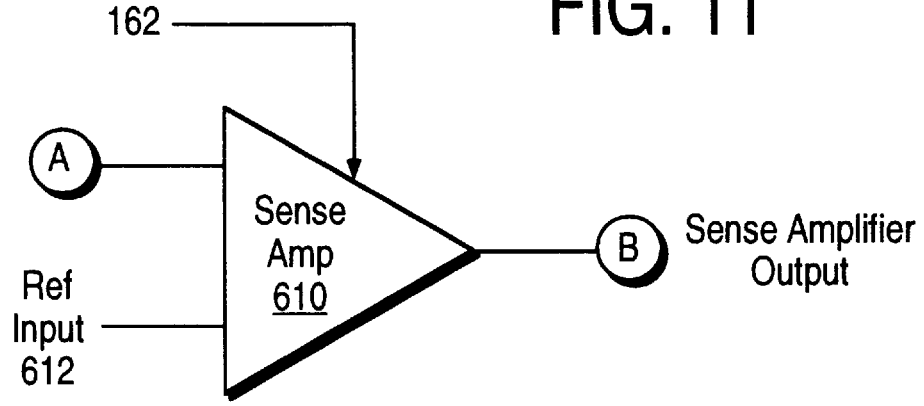
Figure 12:
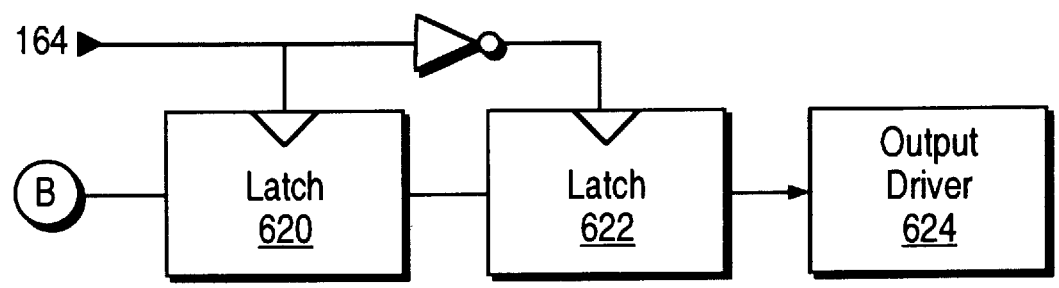

FIGS. 10, 11, and 12 show an example of how control signals 160, 162, and 164 might be used in one embodiment of a memory device. FIG. 10 corresponds to circuit A 170; FIG. 11 corresponds to circuit B 172; and FIG. 12 corresponds to circuit C 174. Of course, the ATD control pulse generator 148 may include many other types of control pulse generators, each one generating one or more control signals for controlling other circuitry. The specific control pulse generators described herein are meant to be for example only.

FIG. 10 shows an example of row and column circuitry for accessing a memory cell within a memory array. The control signals 160 are comprised of a row decoder enable and a column decoder enable. A row address and a column address select a memory cell of the memory array. The control signals 160 enable decoding by coupling the wordline and bitline of the selected memory cell to an output A.

FIG. 11 shows the output A from FIG. 10 coupled as an input to a sense amp 610. A reference input 612 is also coupled as an input to the sense amp. Control signal 162 enables the sense amp to provide a sense amp output B.

FIG. 12 shows the sense amp output B from FIG. 11 provided as an input to a first latch 620. Control signal 164 is coupled to the first latch 620 to allow the sense amp output B to propagate to a second latch 622. Control signal 164 is inverted to control the second latch 622 to provide the sense amp output B to an output driver 624 of the memory device.

Other possible usages of the control signals 162 and 164 include enabling and disabling circuitry, latching signals, controlling latch synchronization, pre-charging nodes, and powering down circuitry not being used, for example, to save power and to provide better noise immunity.

Figure 4:
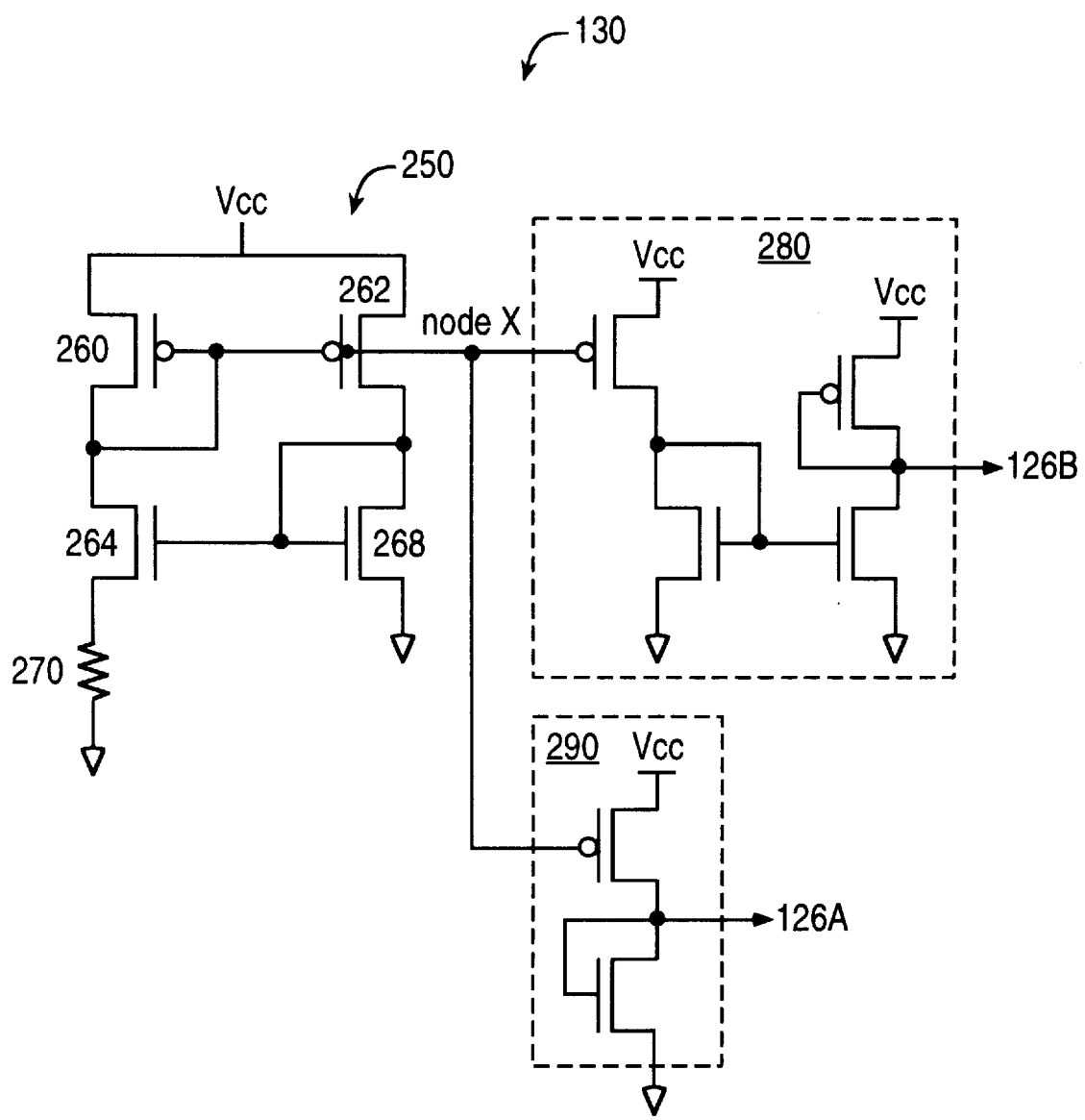
FIG. 4 shows one embodiment of environmental circuit 130.

FIG. 4 shows one embodiment of environmental circuit 130. For this embodiment, circuit 130 is resistor-based. The resistor-based circuit provides voltage outputs 126A and 126E, that are temperature-dependent because the resistivity increases with temperature. In the environmental circuit 130, the voltage 126A increases with increasing temperature. The voltage 126B decreases with increasing temperature.

Generally, in a device, as VCC increases, delays within the device become shorter. Conversely, as VCC decreases, delays within a device become longer. By using environmental circuit 130 these types of environmental fluctuations can be compensated for.

For this embodiment, environmental circuit 130 is comprised of three circuits 250, 280, and 290 coupled together at node X. The first section 250 is comprised of two p-type transistors, two n-type transistors, and a resistor. The source of p-type transistor 260 is coupled to Vcc. The drain of the p-type transistor 260 is coupled to the drain of n-type transistor 264. The source of n-type transistor 264 is coupled to resistor 270. The other end of resistor 270 is coupled to ground. In parallel, the source of p-type transistor 262 is coupled to Vcc. The drain of p-type transistor 262 is coupled to the drain of n-type transistor 268. The source of n-type transistor 268 is coupled to ground. The drain of p-type transistor 260 is coupled to the gates of both transistors 260 and 262 as well as to node X. Similarly the drain of p-type transistor 262 is coupled to the gates of both transistors 264 and 268.

A first output circuit 280 is coupled to node X to provide a first environmental input voltage 126B. Voltage 126B decreases with increasing temperature.

A second output circuit 290 is coupled to node X to provide a second environmental input voltage 126A. Voltage 126A increases with increasing temperature.

In one embodiment, only one of the environmental inputs 126B is used to provide correction to the address transition detector 120 and to the ATD control pulse generators 148. In another embodiment, such as will be described with respect to FIG. 9, both environmental inputs 126B and 126A are used to provide correction to the address transition detector 120 and to the ATD control pulse generators 148.

For another embodiment, other well-known circuitry which varies with temperature may be employed to provide an environmental input to the address transition detector 120 and to the ATD control pulse generators 148.

Additionally, the environmental circuit 130 varies with the voltage supplied to it. It is assumed that the voltage supplied to the environmental circuit 130 is the same as the voltage supplied to the ATD 120. For one embodiment, a single voltage source is provided to the ATD device 110. The voltage source is coupled to both the address transition detector 120 and the environmental circuit 130. For another embodiment, the environmental circuit 130 resides within the address transition detector 120 or within the ATD control pulse generators 148. The environmental circuit 130 is used to regulate the output transition detection signals 132 of the ATD based upon the supply voltage. The environmental circuit 130 is also used to regulate the control signals produced by the ATD control pulse generators 148. For another embodiment, other well-known circuitry which varies with voltage may be employed to provide an input to the ATD circuits.

Similarly, the environmental circuit 130 is dependent upon the process skew of the ATD device 110. For this embodiment, the environmental circuit 130 resides within the ATD device 110. The environmental circuit 130 is used to regulate the output transition detection signals of the ATD 120 based upon the process skew of the ATD device 110. The environmental circuit 130 is also used to regulate the control signals produced by the ATD control pulse generators 148. For another embodiment, other well-known circuitry which varies with the process skew of the ATD 120 may be employed.

Figure 5:
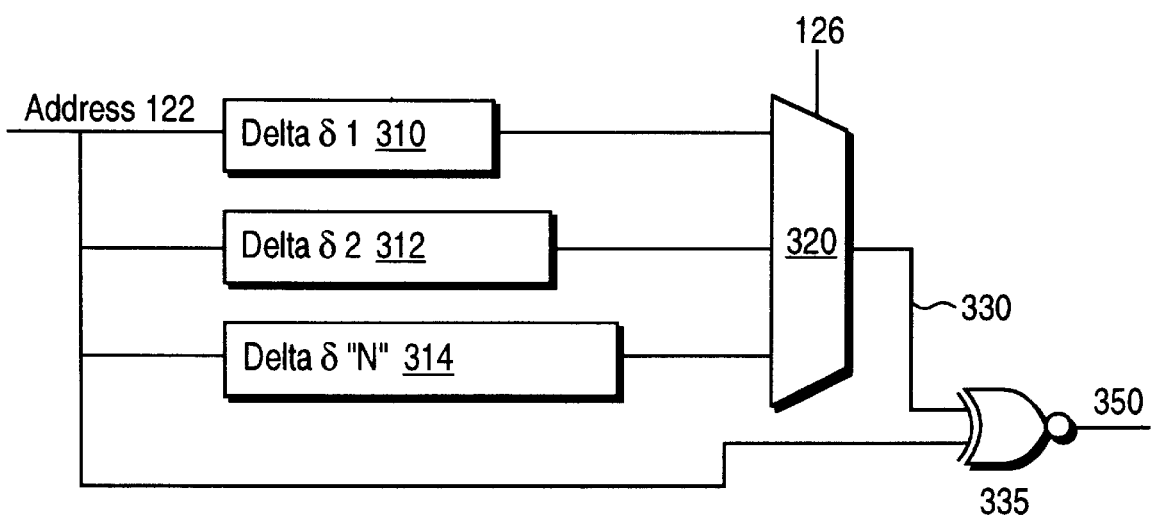
FIG. 5 shows a block diagram showing one embodiment of the ATD using the environmental feedback from environmental circuit 130.

FIG. 5 shows a block diagram showing one embodiment of the ATD using the environmental input 126 from environmental circuit 130. The address input 122 is provided to three delay circuits 310, 312, and 314. Each of the delay circuits provides a different amount of delay. Each of the delay circuits 310–314 is coupled to provide an input to a multiplexer 320. The environmental input 126 selects among the delay circuit inputs to provide a delayed output 330. The delayed output 330 is XNORed (using an XNOR gate 335) with the original address input 122 to provide an output pulse 350 indicative of a transition in the address input.

Figure 6:
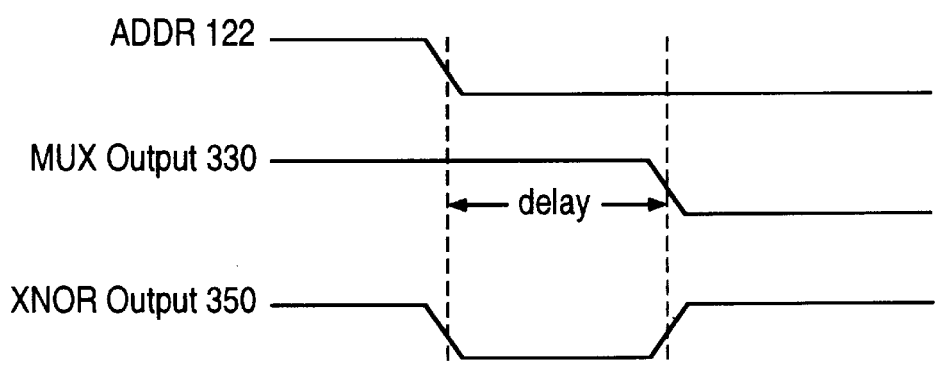
FIG. 6 shows a timing diagram of a transition in the address input 122.

FIG. 6 shows a timing diagram corresponding to FIG. 5 illustrating a transition in the address input 122. The address input 122 is delayed by one of the delay circuits 310–314 to produce a delayed output 330 from the multiplexer 320. The address input 122 and the delayed output 330 are provided to the XNOR gate 335 to produce the XNOR output 350.

For one embodiment, the address input 122 is comprised of multiple address lines, and each address line is delayed in a similar fashion to produce a XNOR output 350.

Figure 7:
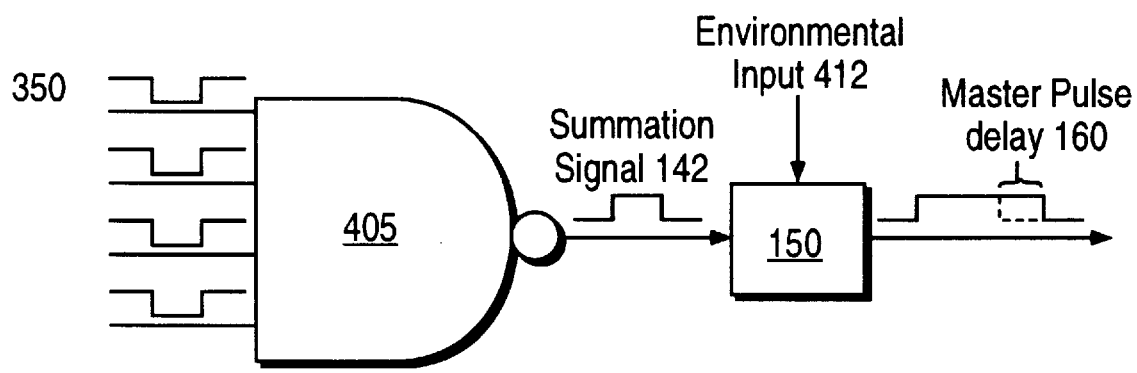
FIG. 7 shows each of the XNOR outputs 350 being combined using a NAND gate to produce a summation signal.

FIG. 7 shows each of the XNOR outputs 350 (corresponding to transitions on multiple address lines of address input 122) being combined using a NAND gate 405 to produce a summation signal 142. The summation signal 142 is provided to a master pulse generator 150, which receives a second environmental input 412 from environmental circuit 130.

For one embodiment the master pulse generator 150 adds a delay to the falling edge of the summation signal to produce a master pulse 160, which is used to control circuitry within the ATD device. Other control pulses are derived from the master pulse 160. For this embodiment, the width of the master pulse is widened dependent upon the second environmental input 412. The second environmental input 412 can be identical to environmental input 126 or it can be a different environmental input generated by environmental circuit 130.

Figure 8:
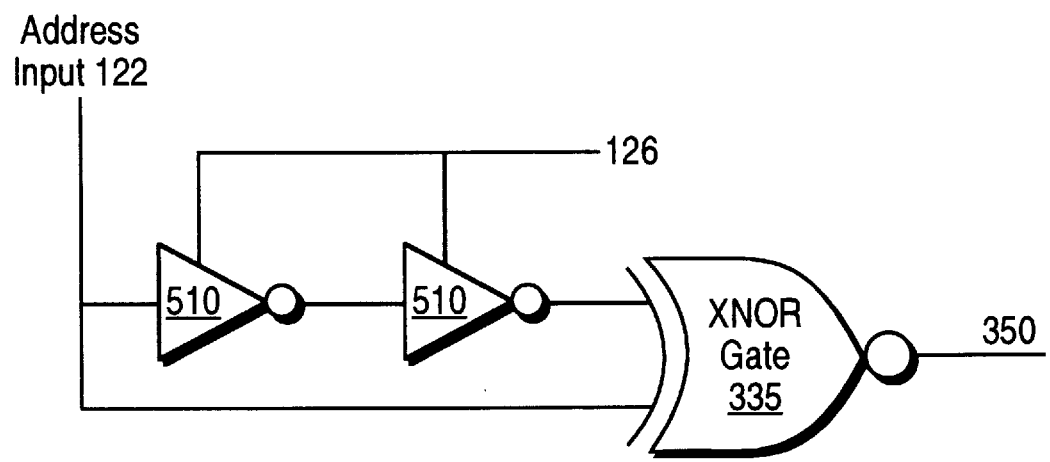
FIG. 8 shows another embodiment for using the environmental input to provide a delay to the address input 122.

FIG. 8 shows an alternate embodiment of FIG. 5. The address input 122 is provided to one or more delay circuits 510. Each of the delay circuits 510 receive an environmental input 126. The output of the delay circuits 510 is XNORed with the address input 122 using the XNOR gate 335. The output 350 of the XNOR gate 335 is indicative of a transition in the address input.

Figure 9:
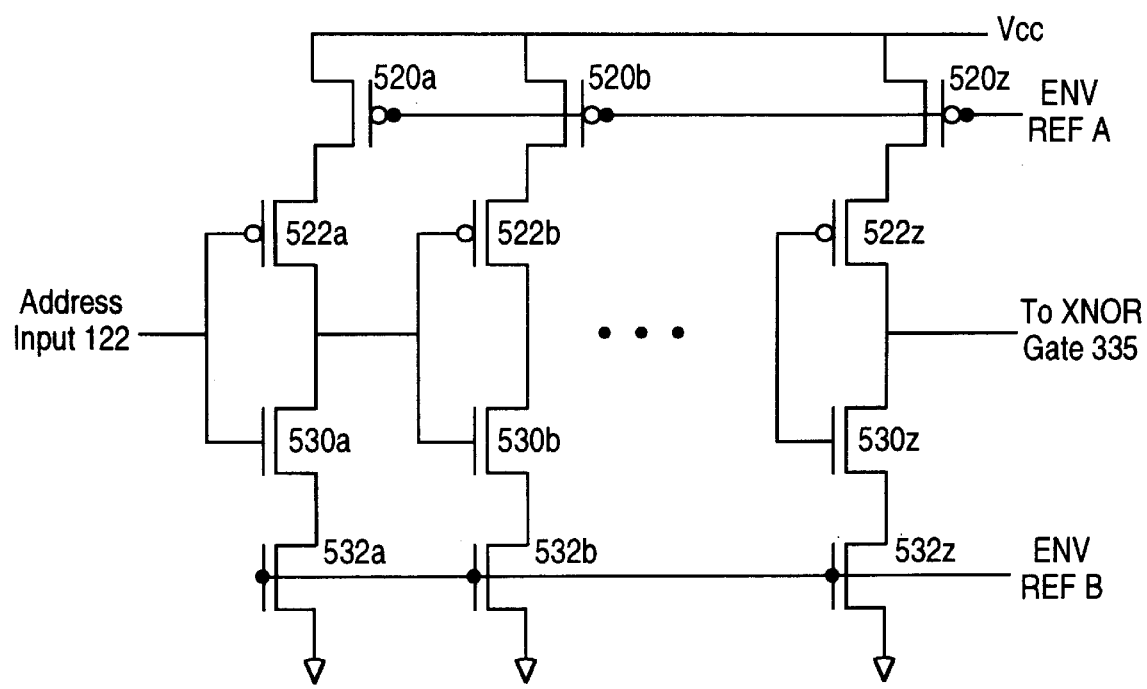
FIG. 9 shows one configuration of circuitry for implementing the delay circuitry of FIG. 8. The delay chain 510 is comprised of multiple inverters.

FIG. 9 shows one configuration of circuitry for implementing the delay circuitry of FIG. 8. For this embodiment, the delay circuits 510 are comprised of a chain of inverters. Each inverter is comprised of two p-type transistors 520a–z and 522a–z and two n-type transistors 530a–z and 532a–z.

The source of each of the transistors 520a–z are coupled to Vcc. A first environmental reference voltage is coupled to the gate of the set of p-type transistors 520a–z. Similarly, the source of each of the transistors 532a–z are coupled to ground. A second environmental reference voltage is coupled to the gate of the set of n-type transistors 532a–z. The address input 122 is coupled to both the gates of transistors 522a and 530a of the first inverter. The drains of transistors 522a and 530a are coupled to the gates of transistors 522b and 530b of the next inverter. Other inverters are coupled similarly in parallel. The drain of the last transistors 522z and 530z provide an output to the XNOR gate 335 of FIG. 8.

By adjusting the reference voltages provided to each set of transistors 520*a–z* and 532*a–z*, the delay of the delay circuits 510 can be increased or decreased as desired. The same delay circuitry may be implemented in the ATD control pulse generator 148 for providing a delay based upon the environmental input.

In the foregoing specification, the invention has been described with reference to specific exemplar embodiments thereof. It will, however be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit comprising:
   an address transition detector that receives one or more address signals, the address transition detector providing a transition detection signal in response to a transition of at least one of the address signals; and
   a pulse generator coupled to receive the transition detection signal from the address transition detector, the pulse generator also receiving an environmental input, the pulse generator providing a control signal having a delay based upon the environmental input.

2. The circuit of claim 1 wherein the control signal is a control pulse having a width dependent upon the environmental input.

3. The circuit of claim 2 wherein the control pulse controls enabling and disabling of a first circuit.

4. The circuit of claim 1 wherein the control signal is coupled to a latch for latching data.

5. The circuit of claim 1 wherein the control signal is coupled to power down a first circuit.

6. The circuit of claim 1 wherein the environmental input is based on temperature.

7. The circuit of claim 2 wherein the environmental input varies inversely with temperature.

8. The circuit of claim 1 wherein the environmental input is based on a voltage of the circuit.

9. The circuit of claim 1 wherein the environmental input is based on a process skew of the circuit.

10. The circuit of claim 1 wherein the circuit resides within a memory device.

11. A circuit comprising:
    an environmental circuit generating a first environmental input and a second environmertal input;
    an address transition detector that receives one or more address signals and the first environmental input, the address transition detector providing a transition detection signal in response to a transition of at least one of the address signals, wherein the transition detection signal is based upon the first environmental input; and
    a pulse generator coupled to receive the transition detection signal from the address transition detector, the pulse generator coupled to receive the second environmental input, the pulse generator providing a control signal based upon the second environmental input.

12. The circuit of claim 11 further comprising:
    a first circuit coupled to receive the control signal, the first circuit performing an action in response to the control signal.

13. The circuit of claim 11 wherein the first and second environmental inputs vary inversely with temperature.

14. The circuit of claim 13 wherein the environmental circuit includes a resistor-based component.

15. The circuit of claim 11 wherein the first and second environmental inputs vary with a voltage supply of the circuit.

16. A memory device having a first environmental input and a second environmental input, the memory device comprising:
    an address transition detector that receives one or more address signals and the first environmental input, the address transition detector providing a transition detection signal in response to a transition of at least one of the address signals, wherein the transition detection signal has a pulse width based upon the first environmental input; and
    a pulse generator coupled to receive the transition detection signal, the pulse generator coupled to receive the second environmental input, the pulse generator providing a control signal delayed a variable amount of time based upon the second environmental input.

17. The memory device of claim 16 further comprising:
    a memory array coupled to receive the control signal, the memory array accessing data in one or more memory cells responsive to the control signal.

18. A method of providing a control pulse to a circuit within an address transition detection (ATD) device, the control pulse for controlling the circuit, the ATD device having an address input, the method comprising the steps of:
    a) detecting a transition in the address input of the ATD device;
    b) generating an address transition control pulse; and
    c) generating said control pulse using as inputs the address transition control pulse and an environmental input.

19. The method of claim 18 wherein the environmental input is dependent upon a temperature of the ATD device.

20. The method of claim 18 wherein the environmental input is dependent upon a voltage of the ATD device.

21. The method of claim 18 wherein the environmental input is dependent upon a process skew of the ATD device.

22. An improved method for controlling a first circuit of an address transition detection (ATD) device, the method comprising the steps of:
    a) delaying one or more control signals in the ATD device based on an environmental input; and
    b) using the one or more control signals to control the first circuit of the ATD device.

23. The method of claim 22 wherein the environmental input is dependent upon a temperature of the ATD device.

24. The method of claim 22 wherein the environmental input is dependent upon a voltage of the ATD device.

25. The method of claim 22 wherein the environmental input is dependent upon a process skew of the ATD device.

26. A method of providing a control pulse to a target circuit within an address transition detection (ATD) device, the control pulse for controlling the target circuit, the ATD device having an address input, the method comprising the steps of:
    a) generating address transition signals responsive to one or more transitions in the address input to the ATD device, wherein the address transition signals are temperature-corrected;
    b) providing a summation signal based upon the address transition signals to a pulse generator;
    c) generating the control pulse having a delay based upon an input to the pulse generator from an environmental circuit; and
    d) providing the control pulse to the target circuit.

* * * * *